(12) United States Patent
Estrada et al.

(10) Patent No.: US 10,985,299 B2
(45) Date of Patent: *Apr. 20, 2021

(54) LIGHT EMITTING DEVICE WITH PHASE CHANGING OFF STATE WHITE MATERIAL AND METHODS OF MANUFACTURE

(71) Applicant: LUMILEDS LLC, San Jose, CA (US)

(72) Inventors: Daniel Estrada, San Jose, CA (US); Kentaro Shimizu, San Jose, CA (US); Daniel Roitman, San Jose, CA (US); Marcel Rene Bohmer, Eindhoven (NL); Edward Kang, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/290,315

(22) Filed: Mar. 1, 2019

(65) Prior Publication Data

US 2020/0035883 A1 Jan. 30, 2020

Related U.S. Application Data

(63) Continuation of application No. 15/722,903, filed on Oct. 2, 2017, now Pat. No. 10,276,763.

(Continued)

(51) Int. Cl.
*H01L 33/00* (2010.01)
*H01L 33/58* (2010.01)
(Continued)

(52) U.S. Cl.
CPC ............ *H01L 33/58* (2013.01); *C09C 1/0081* (2013.01); *C09C 1/0084* (2013.01); *C09K 5/06* (2013.01);
(Continued)

(58) Field of Classification Search
CPC ......... H01L 23/00; H01L 33/00; H01L 33/50; H01L 33/58; H01L 33/44; H01L 33/06;
(Continued)

(56) References Cited

U.S. PATENT DOCUMENTS

| 5,083,251 A | 1/1992 | Parker |
| 5,744,280 A | 4/1998 | Mooney, III et al. |

(Continued)

FOREIGN PATENT DOCUMENTS

| JP | 2010528853 A | 8/2010 |
| JP | 2012-504860 A | 2/2012 |

(Continued)

OTHER PUBLICATIONS

Knowles, "Kinetic Isotope Effects in Organic Chemistry", MacMillan Group Meeting (Sep. 14, 2005).

(Continued)

*Primary Examiner* — Chuong A Luu

(57) ABSTRACT

Light emitting devices (LEDs) are described herein. An LED includes a light emitting semiconductor structure, a wavelength converting material and an off state white material. The light emitting semiconductor structure includes a light-emitting active layer disposed between an n-layer and a p-layer. The wavelength converting material has a first surface adjacent the light emitting semiconductor structure and a second surface opposite the first surface. The off state white material is in direct contact with the second surface of the wavelength converting material and includes multiple core-shell particles disposed in an optically functional material. Each of the core-shell particles includes a core material encased in a polymer or inorganic shell. The core material includes a phase change material.

26 Claims, 4 Drawing Sheets

Related U.S. Application Data

(60) Provisional application No. 62/403,994, filed on Oct. 4, 2016.

(51) Int. Cl.
  *H01L 33/50* (2010.01)
  *C09K 5/06* (2006.01)
  *C09C 1/00* (2006.01)
  *H01L 33/56* (2010.01)

(52) U.S. Cl.
  CPC ............ *H01L 33/505* (2013.01); *H01L 33/56* (2013.01); *C01P 2006/60* (2013.01); *H01L 2933/0091* (2013.01)

(58) Field of Classification Search
  CPC ..... H01L 33/56; H01L 33/501; H01L 33/507; H01L 33/502; H01L 33/64; H01L 33/505; H01L 33/60; H01L 2933/0091; H01L 2933/0058; H01L 23/528; H01L 2224/48095; H01L 2224/48247; H01L 33/36; H01L 33/40; H01L 33/42; H01L 33/52; H01L 33/504; H01L 33/648; H01L 27/15; H01L 27/156; H01L 2933/00; H01L 2933/005; H01L 2933/0016; H01L 2933/0066
  USPC .......................................................... 257/98
  See application file for complete search history.

(56) References Cited

U.S. PATENT DOCUMENTS

| | | | |
|---|---|---|---|
| 8,631,855 B2 | 1/2014 | Maxik et al. | |
| 8,921,473 B1 | 12/2014 | Hyman | |
| 9,061,941 B2 | 6/2015 | Kang et al. | |
| 9,102,857 B2 | 8/2015 | Weaver et al. | |
| 9,540,329 B2 | 1/2017 | Beers et al. | |
| 2006/0086096 A1 | 4/2006 | Ghoshal | |
| 2009/0057699 A1* | 3/2009 | Basin | H01L 33/56 257/98 |
| 2009/0236622 A1 | 9/2009 | Nishihara | |
| 2010/0014839 A1 | 1/2010 | Benoy et al. | |
| 2010/0168275 A1 | 7/2010 | Zhao et al. | |
| 2010/0201241 A1* | 8/2010 | Weaver | F21V 29/004 313/46 |
| 2018/0034134 A1 | 2/2018 | Dalmia | |

FOREIGN PATENT DOCUMENTS

| | | |
|---|---|---|
| JP | 2012-179804 A | 9/2012 |
| JP | 2013504511 A | 2/2013 |
| WO | 2010/038097 A1 | 4/2010 |
| WO | 2012/117736 A1 | 7/2012 |

OTHER PUBLICATIONS

Li et al., "Fabrication and Properties of Microencapsulated Paraffin@SiO2 Phase Change Composite for Thermal Energy Storage", ACS Sustainable Chemistry Engineering, pp. 374-380 (2013).
Pang et al., "Fabrication of silicone oil microcapsules with silica shell by miniemulsion method," In Colloids and surfaces A: Physicochemical and Engineering Aspects, vol. 364, Issues 1-3, pp. 42-48 (2010).
From the EPO as the ISA, International Search Report corresponding to PCT/US2017/055073, dated Nov. 27, 2017, 3 pages.
From the EPO as the ISA, Written Opinion of the International Searching Authority corresponding to PCT/US20171055073, dated Nov. 27, 2017, 5 pages.

* cited by examiner

LIGHT EMITTING DEVICE WITH PHASE CHANGING OFF STATE WHITE MATERIAL AND METHODS OF MANUFACTURE

CROSS REFERENCE TO RELATED APPLICATIONS

This application is a continuation of U.S. patent application Ser. No. 15/722,903, filed Oct. 2, 2017, which claims the benefit of U.S. Provisional Patent Application No. 62/403,994 filed Oct. 4, 2016, which is incorporated by reference as if fully set forth herein.

BACKGROUND

Light emitting diodes may be used as white light sources in various applications, such as flash sources for cellular telephone cameras and filament lamps. Such LEDs may be referred to herein as white LEDs. White LEDs may appear to emit white light from the perspective of the viewer when the LEDs are in an on state. However, they may actually be made up of light emitting semiconductor structures that emit non-white light as well as wavelength converting structures that make the non-white light appear white to the viewer. For example, a white LED may be formed from a blue light emitting semiconductor structure covered by a yellow emitting phosphor layer. Photons of blue light emitted by the light emitting semiconductor structure may either pass through the yellow emitting phosphor layer as blue photons or may be converted into yellow photons by the yellow emitting phosphor layer. The blue and yellow photons that are ultimately emitted out of the LED combine to make the light emitted from the LED appear white to the viewer.

SUMMARY

Light emitting devices (LEDs) are described herein. An LED includes a light emitting semiconductor structure, a wavelength converting material and an off state white material. The light emitting semiconductor structure includes a light-emitting active layer disposed between an n-layer and a p-layer. The wavelength converting material has a first surface adjacent the light emitting semiconductor structure and a second surface opposite the first surface. The off state white material is in direct contact with the second surface of the wavelength converting material and includes multiple core-shell particles disposed in an optically functional material. Each of the core-shell particles includes a core material encased in a polymer or inorganic shell. The core material includes a phase change material.

DETAILED DESCRIPTION OF THE PREFERRED EMBODIMENTS

While white LEDs may appear to emit white light in their on states, such LEDs may appear to be the color of the wavelength converting material when turned off. For example, a white LED that includes a yellow emitting phosphor layer may appear yellow or green to a viewer when turned off, such as when being viewed on a store shelf. Nevertheless, an ordinary consumer may expect a product that includes a white LED to appear white even in the off state. For example, a person who walks into a store to purchase a white light bulb will usually expect the white light bulb to actually appear white and may think that the light bulb is defective if it appears yellow or green. The same may be true of a cellular telephone consumer who may expect the camera flash to appear white. Such products would be more marketable to the consumer if the LED appeared white in the off state as well as in the on state.

Granules of white, non-phosphor, inert materials have been used to provide an off-state white appearance for LEDs. Examples of such materials include Titanium Dioxide (TiOx) and Zirconium Oxide (ZrOx). Sub-micron size particles of these materials may be mixed in with a transparent material, such as silicone, and applied over a non-white LED surface to make it appear whiter to a viewer in the LED off state. However, such granules of white, non-phosphor, inert materials remain white while the device is on. Thus, they may provide some scattering of light emitted from the LED, reducing the LED's lumen output.

Embodiments described herein provide for a white LED that may appear white to the viewer in both the LED on and off states, and also reduce or eliminate scattering in the LED on state, making products that include such LEDs more aesthetically pleasing to the viewer without impacting the quality of the LED itself. Such embodiments may make use of phase change materials (PCMs), such as paraffin waxes and deuterated paraffin analogs, applied over a non-white LED surface. Such PCMs may appear white at room temperature when the LED is in the off state but may change phase and become transparent or more transparent when heated as a result of the LED being turned on. Further, for a PCM and a non-PCM, such as ZiOx or ZrOx, having equal whiteness in the off state, losses in the on state may be lower for the PCM than other off state white materials because scattering is decreased for the PCMs at operating temperature. If the same losses are accepted, a whiter layer may be made with the PCMs.

Figure 1A:
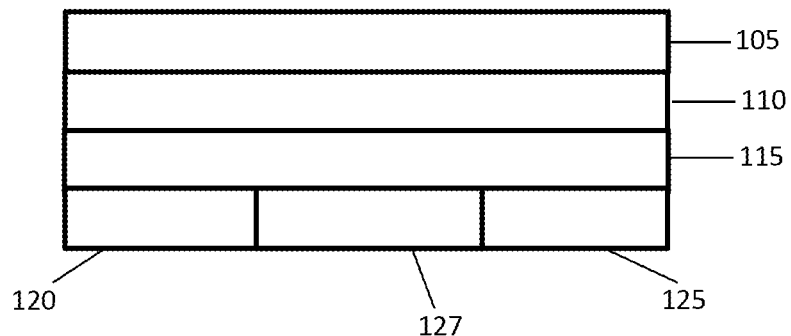
FIG. 1A is a diagram of an example light emitting device (LED) that includes a light emitting semiconductor structure and an off state white material.

FIG. 1A is a diagram of an example light emitting device (LED) 100 that includes a light emitting semiconductor structure 115, a wavelength converting material 110, and an off state white material 105. Contacts 120 and 125 may be coupled to the light emitting semiconductor structure 115, either directly or via another structure such as a submount, for electrical connection to a circuit board or other substrate or device. In embodiments, the contacts 120 and 125 may be electrically insulated from one another by a gap 127, which may be filled with a dielectric material. The contacts or interconnects 120 and 125 may be, for example, solder, stud bumps, or gold layers.

The light emitting semiconductor structure 115 may be any light emitting semiconductor structure that emits light that may be converted to white light via a wavelength conversion material. An example of such a light emitting semiconductor structure 115 is a III-nitride light emitting semiconductor structure that emits blue or UV light, such as a light emitting semiconductor structure formed from one or more of binary, ternary, and quaternary alloys of gallium, aluminum, indium, and nitrogen. Other examples of light emitting semiconductor structures may include light emitting semiconductor structures formed from group III-V materials, II-phosphide materials, III-arsenide materials, II-VI materials, zinc oxide (ZnO), or Silicon (Si)-based materials.

Figure 1B:
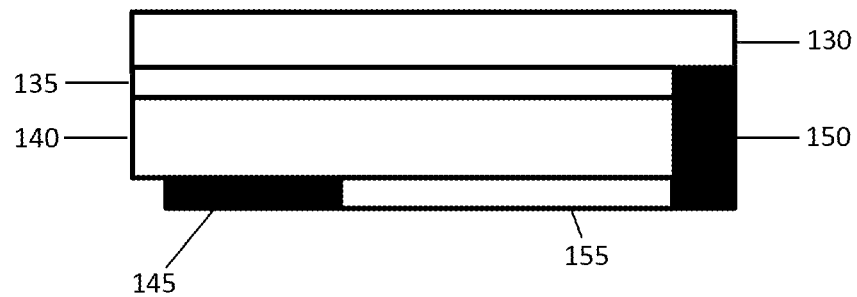
FIG. 1B is a diagram of an example light emitting semiconductor structure that may be included in the LED of FIG. 1A.

FIG. 1B is a diagram of an example light emitting semiconductor structure 115 that may be included in the LED 100 of FIG. 1A. The illustrated example is a flip chip structure. However, one of ordinary skill in the art will understand that the embodiments described herein may be applied to other types of LED designs, such as vertical, lateral, and multi-junction devices.

In the example illustrated in FIG. 1B, the light emitting semiconductor structure 115 includes a light emitting active region 135 disposed between an n-type region 130 and a p-type region 140. Contacts 145 and 150 are disposed in contact with a surface of the light emitting semiconductor structure 115 and electrically insulated from one another by a gap 155, which may be filled by a dielectric material, such as an oxide of silicon. In the illustrated embodiment, contact 145 (also referred to as a p-contact) is in direct contact with a surface of the p-type region 140 and the contact 150 (also referred to as an n-contact) is in direct contact with a surface of the n-type region 130.

The n-type region 130 may be grown on a growth substrate and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Like the n-type region 130, the p-type region 140 may include multiple layers of different composition, thickness, and dopant concentrations, including layers that are not intentionally doped, or n-type layers. While layer 130 is described herein as the n-type region and layer 140 is described herein as the p-type region, the n-type and p-type regions could also be switched without departing from the scope of the embodiments described herein.

The light emitting active region 135 may include a single thick or thin light emitting layer. Alternatively, the light emitting active region 135 may be a multiple quantum well light emitting region, which may include multiple thin or thick light emitting layers separated by barrier layers.

The p-contact 145 may be formed on a surface of the p-type region 140. The p-contact 145 may include multiple conductive layers, such as a reflective metal and a guard metal, which may prevent or reduce electromigration of the reflective metal. The reflective metal may be silver or any other suitable material. The re-contact 150 may be formed in contact with a surface of the n-type region 130 in a region where portions of the active region 135, the n-type region 140, and the p-contact 145 have been removed to expose at least a portion of the surface of the n-type region 130.

The n-contact 150 and p-contact 145 are not limited to the arrangement illustrated in FIG. 1B and may be arranged in any number of different ways. In embodiments, one or more n-contact vias may be formed in the light emitting semiconductor structure 115 to make electrical contact between the re-contact 150 and the n-type layer 130. Alternatively, the n-contact 150 and p-contact 145 may be redistributed to form bond pads with a dielectric/metal stack as known in the art. The p-contact 145 and the n-contact 150 may be electrically connected to the contacts 120 and 125 of FIG. 1A, respectively, either directly or via another structure, such as a submount.

The wavelength conversion material 110 may be any luminescent material, such as a phosphor or phosphor particles in a transparent or translucent binder or matrix that absorbs light of one wavelength and emits light of a different wavelength. The wavelength conversion material 110 may be applied in a layer having a thickness that may depend on the wavelength conversion material used. For example, a layer of wavelength conversion material 110 may be approximately 50 μm in thickness while other wavelength conversion materials may be formed in layers as thin as 20 μm or as thick as 100 μm. In embodiments, the wavelength conversion material 110 may be pre-formed into a wavelength conversion element and attached to the light emitting semiconductor structure 115 using an adhesive or any other method or material known in the art.

In embodiments, the light emitting semiconductor structure 115 emits blue light. In such embodiments, the wavelength conversion material 110 may include, for example, a yellow emitting wavelength conversion material or green and red emitting wavelength conversion materials, which will produce white light when the light emitted by the respective phosphors combines with the blue light emitted by the light emitting semiconductor structure 115. In other embodiments, the light emitting semiconductor structure 115 emits UV light. In such embodiments, the wavelength conversion material 110 may include, for example, blue and yellow wavelength converting materials or blue, green and red wavelength converting materials. Wavelength converting materials emitting other colors of light may be added to tailor the spectrum of light emitted from the device 100.

The wavelength converting material 110 may include conventional phosphor particles, organic semiconductors, II-VI or III-V semiconductors, II-VI or III-V quantum dots or nanocrystals, dyes, polymers, or materials such as gallium nitride (GaN) that luminesce. Any suitable phosphor may be used, including garnet-based phosphors, such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors, such as $(Ca,Sr)AlSiN_3$: Eu and $(Ca,Sr,Ba)_2Si_5N_8$:Eu. In embodiments where the wavelength conversion material is a YAG phosphor, the color temperature of the white light may depend largely on the Ce doping in the phosphor as well as on the thickness of the phosphor layer.

Figure 1C:
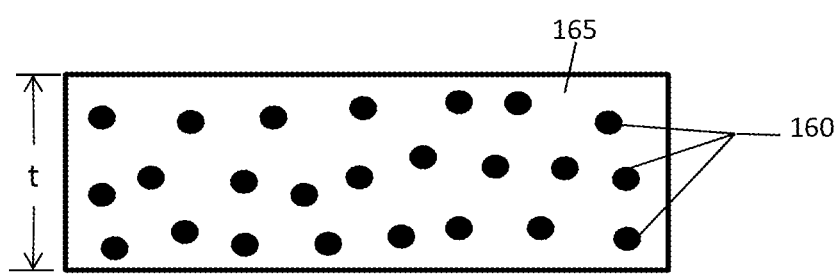
FIG. 1C is a diagram of an example layer of an off state white material that may be included in the LED of FIG. 1A.

FIG. 1C is a diagram of an example layer of off state white material 105 that may be included in the LED 100 of FIG. 1A. The off state white material 105 may be formed from a plurality of core-shell particles 160 disposed in an optically functional material 165, which may be, for example, silicone or any transparent or near transparent material, or a temperature and light resistant matrix, such as a silicone matrix.

In embodiments described herein, various paraffin waxes, such as docosane, tricosane, hexacosane, or octacosane, may be used in the off state white material 105, and the paraffin waxes may be included in the core material of the core-shell particles 160, as is described in more detail below. These paraffin materials may appear white at room temperature (i.e., when the LED is in the off state). Unlike other white pigments, such as TiOx, that remain white when the LED is in the on state, paraffin melts and becomes transparent or near transparent as a result of the LED being switched on.

As a specific example, the heat from the LED in the on state causes tricosane, which has a melting point of 46° C., to melt and become significantly more transparent and, therefore, reduces the amount of scattering of light emitted from the light emitting semiconductor structure and wavelength conversion material as compared to non-PCMs, such as TiOx. The reduction in scattering achieved using paraffin in the off state white material 105 means the light interacts less with surfaces that can absorb the emitted light and, therefore, the use of a paraffin as the PCM in the off state white material 105 results in increased efficiency compared to $TiO_x$ in the off state white material.

The specific paraffin to be used may be chosen and adapted based on various factors described in more detail below. The chosen paraffin should, in any event, become transparent, or nearly transparent, at a device temperature corresponding to an on state of the LED so that light emitted by the light emitting semiconductor structure 115 may pass through with little or no reduction in lumen output as compared to an LED that does not include an off state white material 105.

The improvement gained in reduction of light scattering by using a PCM instead of white pigments such TiOx in the off state white material may be negated by degradation of the material, which may cause a decrease in reflectivity and reduce the efficacy when the LED is on, and may also decrease the whiteness when the LED is off. For example, experimentation with use of phase change materials (PCMs) has presented a problem that both the processing and operational conditions of LEDs (e.g., high soldering temperatures) cause degradation of the paraffin wax, which may drastically affect lumen output of the LED. For example, operation at 350 mA and 80° C. does not lead to degradation of a $TiO_x$ containing off state white material, but the LED performance of an LED with a paraffin-containing off state white material decreases after tens to hundreds of hours.

Further, as paraffin waxes are organic materials, and LEDs operate at high light flux and temperature, thermal and photo-thermal degradation may be a concern for the use of these PCMs for LED applications. More specifically, it has been observed that PCMs may degrade and reduce in switching amplitude between white and transparent or nearly transparent after repeated switching and may even turn yellow or brown over time. This may result from light or heat induced chemical modifications, changing the crystallization of the paraffin and leading to slower switching amplitude. The breaking of a carbon-hydrogen (C—H) bond in the paraffin may be the starting point for changes that may ultimately lead to ceasing of the switching behavior of the paraffin. The reduction of the switching behavior has been observed to be less for an encapsulated paraffin in silicone, but to an insufficient extent, indicating the importance of the breakage of C—H bonds as a first step in the degradation of the of the paraffin material.

The observed degradation for paraffin materials over time may be substantially mitigated or eliminated by replacing the C—H bonds with carbon-deuterium (C-D) bonds to create a deuterated paraffin analog. By using a deuterated paraffin analog as opposed to a non-deuterated paraffin in the off state white material 115, a C-D bond would have to break to start the degradation process. However, the C-D bond is stronger than the C—H bond due to the kinetic isotope effect and, thus, the deuterated paraffin may be more stable for use on an LED. More specifically, at room temperature, the reaction rate for breaking the C-D versus the C—H bond is a factor 7 such that the difference in reaction rates between a paraffin and a deuterated paraffin analog may amount up to 7 times.

Depending on the desired switching temperature of the deuterated paraffin analog, different chain lengths may be chosen. For example, a deuterated paraffin may be chosen that has a high enough melting point such that it does not melt at ambient or close to body temperature and a low enough melting point that it melts when the LED is switched on. In embodiments, a deuterated paraffin with a melting point at or lower than 40° C. may be used. For most applications, a deuterated paraffin with a melting point with a maximum value of less than 100° C. may be chosen. For flash applications, a deuterated paraffin with an even higher melting point may be chosen, such as a deuterated paraffin with a maximum melting point of 150° C. In all applications, the chosen paraffin should have a melting point in the temperature range reached when the LED is switched on at the relevant current and should show a crystalline solid to liquid transition. In the solid state, the chosen paraffin should be sufficiently scattering so as to appear white to a viewer in ambient lighting. Given the melting point considerations for paraffins described above, it should be noted that a paraffin with a lower melting point will melt more quickly than a paraffin with a higher melting point and, therefore, will allow for a quicker switching time between the on and off states. However, a paraffin with a higher melting point, while slower to switch between the on and off states, will have a slower evaporation rate and, therefore, use of a such a paraffin as the PCM in an off state white material may result in slower evaporation and help to reduce degradation by loss of paraffin over time.

In embodiments, deuterated tricosane may be used. Other example deuterated paraffin analogs that may be suitable for use in an LED depending on desired switching temperature may include deuterated docosane ($C_{22}D_{46}$), which has a switching temperature of 43° C., deuterated hexacosane, which has a switching temperature of 56° C., and deuterated octacosane, which has a switching temperature of 64° C.

Paraffin waxes and deuterated paraffin analogs may be particularly useful as off state white materials because they begin to melt at a particular melting temperature, resulting in the paraffin changing from white to transparent or near transparent. However, due to the phase change of the materials (i.e., melting) that causes the change in transparency of the material, a mechanism is needed to contain the paraffin so that it does not diffuse out of the device (or layer 105). The optically functional material 165, such as silicone, cannot, itself, prevent the paraffin or deuterated paraffin analog from diffusing out.

In embodiments, the paraffin or deuterated paraffin analog may be encapsulated in core-shell particles 160. In embodiments, the paraffin or deuterated paraffin analog may be encapsulated in the core-shell particles 160 along with a nucleation agent (e.g., stearic acid) for the liquid-solid transition that may be present at concentrations of 1% or approximately 1%. The core-shell particles 160 may be dispersed or embedded in an optically functional material 165 to form the off state white material 105.

The optically functional material 165 may be a polymer, such as silicone, a temperature and light resistant matrix, such as an optical grade silicone matrix, or any other suitable material, such as a sol-gel material, an organically modified ceramic (ormocer), or a polysilizane based matrix. The shells for the particles may be polymer or inorganic shells, such as melamine formaldehyde-based shells or silica-based shells. The core-shell particles may have a diameter in the range of 1 µm to 50 µm. In embodiments, the core-shell particles may have a diameter in the range of 1 µm to 20 µm.

An acceptable range of thicknesses for the shells may depend on the refractive index of the shell. If the refractive index of the shell is the same as or close to the refractive index of the paraffin or silicone, shell thickness may not matter. If the refractive index of the shell is higher than the paraffin or silicone, the shell may be responsible for residual scattering. In all cases, the shell should be thick enough to contain the paraffin during handling and layer preparation and to subsequently maintain the paraffin encased within the shell during operation of the device.

In FIG. 1C, an off state white material 105 is illustrated, including the encapsulated particles 160 disposed in the optically functional material 165. The off state white material 105 may be applied directly to the phosphor material 110 or other exposed surface of an LED to make the LED appear whiter to the viewer. As with the deuterating of the paraffin, the LED may be further improved to have an even greater photo-thermal stability by deuterating other organic components of the LED, such as the nucleation agent or the polymer shell.

In embodiments, the off state white material 105 may be formed into a layer or film having a thickness, t. The thickness, t, may be chosen to optimize the switching speed of the phase changing material, the physical space taken up by the off state white material 105 in the light emitting semiconductor structure 115, and the overall whiteness of the off state white material 105. For example, a thicker layer may heat up more slowly and, therefore, may cause the phase change material to switch more slowly. A thicker layer may also take up more physical space in the light emitting semiconductor structure 115. However, there is a limit to the volume fraction of phase change material containing core shell particles that can be incorporated into an optically functional material and, therefore, if the off state white material 105 is formed into a layer that is too thin, the material may not achieve optimal whiteness in the off state. In embodiments, a layer of the off state white material 105 may have a thickness, t, of 50 µm. However, the layer may have a thickness, t, as thick as, for example, 100 µm or 200 µm.

To be able to work with a thin layer of off state white material 105, such as the example 50 µm thick layer described above, a high volume fraction of encapsulated paraffin may be used to make the layer appear as white as possible in the LED off state. The upper limit of the volume fraction may be determined by the maximum packing of the paraffin capsules. If this number is exceeded, the layer will contain pores or become very rough. The upper limit depends on the size distribution of the specific sample. For example, in an ordered array, the most dense packing of equal sized spheres would be 74%, and with random packing, would be 64%. In embodiments, the volume fraction of encapsulated paraffin in the off state white material 105 may be in the range of 5%-40% or 50%. Within these ranges, a volume fraction of 20% may be considered to be easily attainable and 50% may be considered to be very high and not possible for every sample.

The shells of the core-shell particles 160 may be subject to certain stresses as a result of the repeated phase change of the PCMs from solid to liquid as the LEDs switch between their off and on states. It has been observed that oxidation of the polymer shell due light and temperature exposure combined with the repeated expansion and contraction may lead to embrittlement of the shell and may eventually cause cracking during a phase change event. The cracked shell may no longer be able to confine the PCM, leading to core material loss due to evaporation. In embodiments, an amount of material that does not undergo a phase change may be introduced into the core with the paraffin or deuterated paraffin analog material to reduce stress on the shell, prolong the life of the materials, and improve LED reliability. In embodiments, a material may be chosen that has properties similar to the optically functional material in light and heat stability. Examples of suitable materials may include a silicone polymer, polysilizanes, sol-gel materials and organically modified ceramics (ormocers). In embodiments, a ratio of 50% to 90% silicone to paraffin or deuterated paraffin analog may be introduced into the core to minimize stress on the shell due to phase changes while maintaining the desirable off state white properties of the off state white material.

It should also be noted that the magnitude of the PCM for optical switching may be determined by the grain size of each PCM domain. For a single domain of paraffin in a polymer shell, there would be minimal optical scattering. Increasing the number of randomly oriented domains of paraffin in a single shell may increase the scattering power of each capsule in the off state. The use of silicone polymer as a filler in the capsules may aid in generating more domains and, therefore, increase the scattering power per amount of paraffin. This may be desirable in the off state to create a more white appearance to the LED.

It should also be noted that, while advantages of the off state white material are described herein for use to cover up the non-white appearance of a wavelength converting layer, the off state white material 105 may be equally applicable for use on a surface of an LED other than on a wavelength converting layer 110 where it is desirable to make the surface appear more white. The silicone or other optically functional material on such a surface of an LED may also protect the semiconductor LED die and further increase light extraction. White LEDs with an off state white material 105 may be used in many different types of applications. One typical example is a flash LED, and examples are provided below with respect to FIGS. 2A and 2B.

Figure 2A:
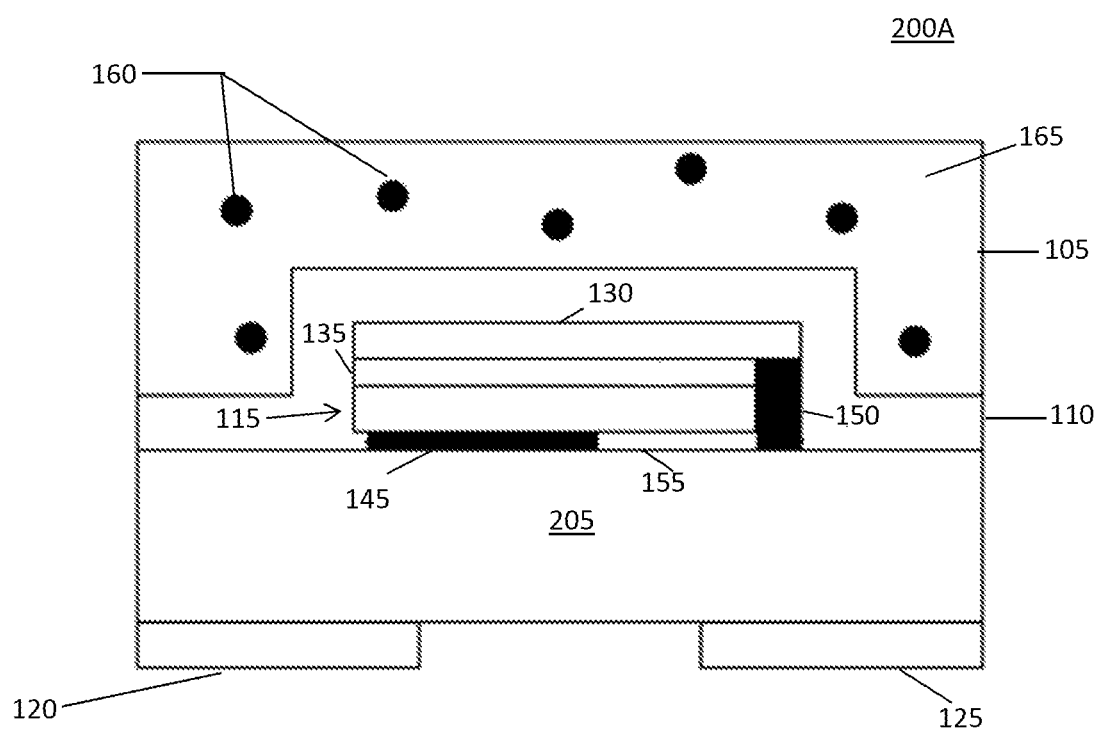
FIG. 2A is a diagram of an example flash LED including an off state white material.

FIG. 2A is a diagram of an example flash LED 200A including an off state white material. In the example illustrated in FIG. 2A, the flash LED 200A includes the light emitting semiconductor structure 115 of FIG. 1B, which is mounted to a submount 205 that includes the contacts 120 and 125. The light emitting semiconductor structure 115 may be mounted to the submount 205 by an electrical coupling between the contacts 145 and 150 on the light emitting semiconductor structure 115 and submount electrodes on an adjacent surface of the submount 205 (not shown in FIG. 2A). The submount electrodes may be electrically connected by vias (not shown) to the contacts 120 and 125 on the opposite surface of the submount 205. The submount 205 may be mounted via the contacts 120 and 125 to a printed circuit board (not shown), which may form a part of the flash module for a camera in embodiments. Metal traces on the circuit board may electrically couple the contacts 120 and 125 to a power supply, such that an operational voltage and current may be applied to the LED when it is desired to turn the LED on.

The submount 205 may be formed from any suitable material, such as ceramic, Si, or aluminum. If the submount material is conductive, an insulating material may be disposed over the substrate material, and the metal electrode pattern may be formed over the insulating material. The submount 205 may act as a mechanical support, provide an electrical interface between the delicate n and p electrodes on the LED chip and a power supply, and provide heat sinking.

In the example flash LED 200A, the wavelength converting material 110 completely surrounds the light emitting semiconductor structure 115 on all surfaces except the surface that electrically connects the light emitting semiconductor structure 115 to the submount 205. The off state white material 105 with optically functional material 165 and core-shell particles 160 is disposed in direct contact with the wavelength conversion material 110.

Figure 2B:
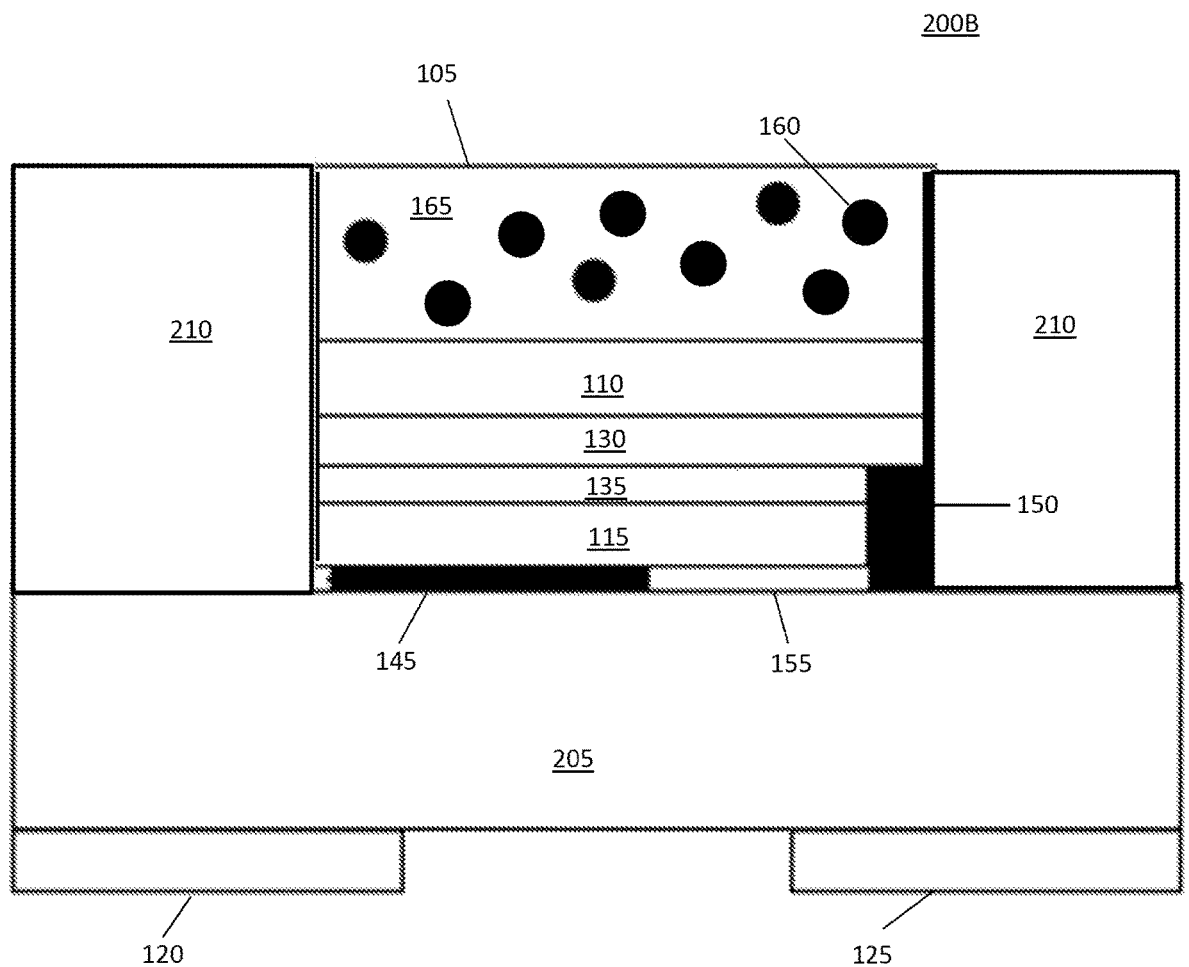
FIG. 2B is a diagram of another example flash LED including an off state white material.

FIG. 2B is a diagram 200B of another example flash LED 200B including an off state white material. In the example flash LED 200B, the wavelength converting material 110 is deposited on the light emitting semiconductor structure 115. The off state white material 105 with optically functional material 165 and core-shell particles 160 is disposed in direct contact with the wavelength conversion material 110. A structure 210, such as a frame, is disposed adjacent side surfaces of a stack formed by the light emitting semiconductor structure 115, the wavelength converting material 110 and the off state white material 105 and may surround the stack. The entire structure 210, but at least inner surfaces of the structure 210 that are adjacent the stack, may be formed from or coated in a light reflecting material, such as an interference layer or a strongly scattering layer, to further minimize absorption of any scattered light.

Figure 3:
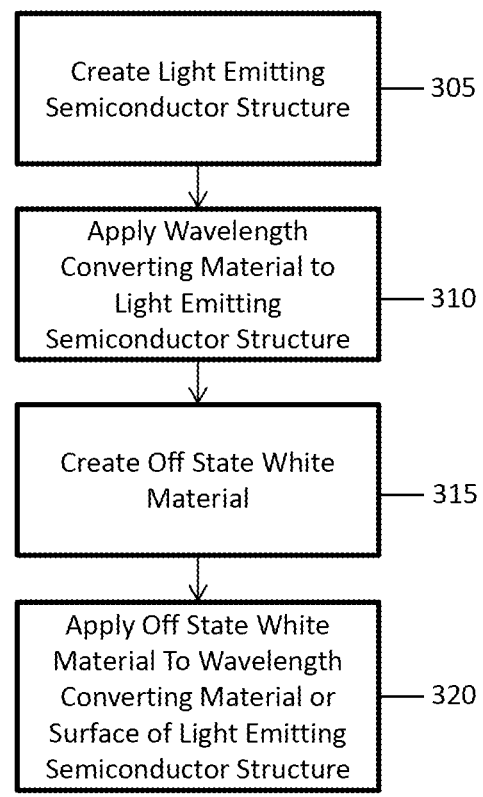
FIG. 3 is a flow diagram of a method of manufacturing an LED with an off state white material.

FIG. 3 is a flow diagram 300 of a method of manufacturing an LED with an off state white material. The example method 300 includes creating the light emitting semiconductor structure 115 (305). The light emitting semiconductor structure may be created, for example, by growing the light emitting semiconductor structure, such as a III-nitride semiconductor structure, on a growth substrate. The growth substrate may be, for example, sapphire or any other suitable substrate such as an SiC, Si, GaN or a composite substrate. In embodiments, the n-type region 130 may be grown first. The light emitting active region 135 may be grown over the n-type region 130. The p-type region 140 may be grown over the light emitting active region 135. After growth, the p-contact 145 may be formed on a surface of the p-type region 140, and then a portion of the p-contact 145, a portion of the p-type region 140 and a portion of the light emitting active region 135 may be removed to expose at least a portion of a surface of the n-type region 130 in contact with which the n-contact 150 may be formed.

In embodiments, such as where the LED 100 is used in an LED flash, such as illustrated in FIG. 2A or 2B, the light emitting semiconductor structure 115 may be mounted on a submount (e.g., the submount 205 in FIG. 2A or 2B) as a flip chip. The surface of the submount adjacent the n-contact 150 and the p-contact 145 may include metal electrodes that may be soldered or ultrasonically welded to the contacts 145 and 150, for example, via solder balls Other types of bonding may also be used. The solders balls may be omitted if the electrodes themselves may be ultrasonically welded together.

The submount electrodes (not shown in FIGS. 2A and 2B) may be electrically connected by vias to contacts 120 and 125 (in this example, they are located on a surface of the submount 205 opposite the surface of the submount that is adjacent to the contacts 145 and 150) so the submount 205 may be surface mounted to metal pads on a printed circuit board, for example, which may form part of a flash module for a camera (e.g., as in the embodiments illustrated in FIGS. 2A and 2B).

In embodiments, the growth substrate may be removed, for example to create a lower profile LED, which may be desirable for the flash module for the camera illustrated in and described with respect to FIGS. 2A and 2B. The growth substrate may be removed, for example, using chemical mechanical polishing (CMP) or laser lift-off, where a laser heats the interface between the light emitting semiconductor structure 115 and the growth substrate to create a high-pressure gas that pushes the growth substrate away from the light emitting semiconductor structure 115. In embodiments, the growth substrate may be removed after an array of LEDs is mounted on a submount wafer and prior to the LED/submounts being singulated (e.g., by sawing). In other embodiments, the growth substrate may remain attached to the light emitting semiconductor structure and, as a result, may become part of the LED. In such embodiments, the growth substrate may be transparent or near transparent to light. In such embodiments, a surface of the growth substrate on which the light emitting semiconductor structure is grown may be patterned, roughened, or textured before growth, which may improve light extraction from the LED. Additionally or alternatively, a surface of the growth substrate opposite the growth surface (i.e., the surface through which a majority of light is extracted in a flip chip configuration) may be patterned, roughened, or textured before growth, which may improve light extraction from the LED.

The example method 300 illustrated in FIG. 3 further includes applying the wavelength converting material 110 to the light emitting semiconductor structure 115 (310). In embodiments, the wavelength converting material 110 may be a layer or film that is, for example, spray deposited, spun-on or thin-film deposited (e.g., by electrophoresis). Alternatively, the wavelength converting material 110 may be formed into an element, such as a ceramic plate, and affixed to the light emitting semiconductor structure 115.

The example method 300 illustrated in FIG. 3 further includes creating the off state white material 105 (315) and applying it to the wavelength converting material 110 or surface of the light emitting semiconductor structure 115 if no wavelength converting material is included (320). This may be done using any method known in the art, such as mixing followed by an application technique.

In embodiments, the off state white material 105, including the optically functional material 165 and the core-shell particles 160, is laminated to the light emitting semiconductor structure 115 or the wavelength converting material 110 (if included). In embodiments, it may be molded directly over the light emitting semiconductor structure 115 and/or wavelength converting material 110 (if included). If it is desired to use the off state white material 105 as a lens, the off state white material may be shaped using a mold to create an off state white switchable lens or microlens.

The terms transparent, near transparent, and more transparent are used herein to describe, for example, the off state white material 105 and the result of the phase change of a PCM from the off (or solid state of the PCM) to the on (or liquid state of the PCM). In this regard, if a solid PCM material, such as a paraffin, melts, it becomes a completely transparent liquid with 100% transparency. However, when the encapsulated PCM materials, as described herein, are disposed in an optically functional material, such as a silicone matrix, there will be a level of residual scattering when the PCM material is in its completely transparent state. This may result from the refractive index of liquid paraffin differing from that of the optically functional material, such as the silicone matrix, and also differing from the refractive index of the shell of the particles containing the paraffin. For example, when samples of paraffin containing capsules are tested on a laser-setup at 450 nm, an increase in direct transmission may be seen of about 50% when the paraffin melts. Apart from direct transmission, there is also diffuse transmission, which is difficult to quantify. As the off state white material 105 is desired to be very white (e.g., strongly scattering) in the off state, the initial direct transmission of the off state white material 105 may be low, such as 2% transparent or less.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light emitting device comprising:
a light emitting semiconductor structure;
a wavelength converting structure arranged in an optical path of light emitted by the light emitting semiconductor structure; and
an off state white structure arranged in an optical path of light emitted by or transmitted through the wavelength converting structure, the off state white structure comprising core-shell particles dispersed in a transparent material, each of the core shell particles comprising a core material that includes a phase-change material encased in a shell.

2. The light emitting device of claim 1, wherein:
the wavelength converting structure comprises a first surface adjacent the light emitting semiconductor structure and a second surface opposite the first surface; and
the off state white structure is in direct contact with the second surface of the wavelength converting structure.

3. The light emitting device of claim 1, wherein the off state white structure comprises between 5 percent and 40 percent by volume fraction of the core-shell particles.

4. The light emitting device of claim 1, wherein each of the plurality of core shell particles has a diameter of between 1 µm and 50 µm.

5. The light emitting device of claim 1, wherein the core material comprises silicone in a ratio of 50% to 90% silicone to the phase change material by weight.

6. The light emitting device of claim 1, wherein the core material comprises a nucleation agent.

7. The light emitting device of claim 1, wherein the phase change material has a melting point of between 43° C. and 100° C.

8. The light emitting device of claim 1, wherein the phase change material is deuterated.

9. The light emitting device of claim 1, wherein the phase change material is selected from the group consisting of paraffin, deuterated paraffin, tricosane, deuterated tricosane, docosane, deuterated docosane, hexacosane, deuterated hexacosane, octacosane, and deuterated octacosane.

10. The light emitting device of claim 1, wherein the shell is a polymer or inorganic shell.

11. The light emitting device of claim 1, wherein the shell is deuterated.

12. The light emitting device of claim 1, wherein:
the wavelength converting structure comprises a first surface adjacent the light emitting semiconductor structure and a second surface opposite the first surface;
the off state white structure is in direct contact with the second surface of the wavelength converting structure; and
the phase change material comprises deuterated paraffin.

13. The light emitting device of claim 12, wherein the core material comprises silicone in a ratio of 50% to 90% silicone to the phase change material by weight.

14. The light emitting device of claim 12, wherein the core material comprises a nucleation agent.

15. The light emitting device of claim 12, wherein the shell is deuterated.

16. A light emitting device comprising:
a light emitting structure; and
an off state white structure arranged in an optical path of light emitted by the light emitting structure and comprising core-shell particles dispersed in a transparent material, each of the core shell particles comprising a core material that includes a phase-change material encased in a shell.

17. The light emitting device of claim 16, wherein the phase change material has a melting point of between 43° C. and 100° C.

18. The light emitting device of claim 16, wherein the phase change material is deuterated.

19. The light emitting device of claim 16, wherein the core material comprises a nucleation agent.

20. The light emitting device of claim 16, wherein the shell is deuterated.

21. The light emitting device of claim 1, wherein the light emitting semiconductor structure is a blue light emitting semiconductor structure.

22. The light emitting device of claim 21, wherein the wavelength converting structure comprises one of a yellow-emitting phosphor material or green-emitting and red- emitting phosphor materials.

23. The light emitting device of claim 1, wherein the transparent material comprises silicone and the core-shell particles are dispersed in the silicone.

24. The light emitting device of claim 1, wherein the transparent material comprises a temperature and light resistant matrix and the core-shell particles are embedded in the temperature and light resistant matrix.

25. The light emitting device of claim 1, wherein the off state white structure is disposed on the wavelength converting structure as a layer or a film.

26. The light emitting device of claim 1, wherein the transparent material forms a lens.

* * * * *